(12) United States Patent
Zhou et al.

(10) Patent No.: US 10,037,914 B2
(45) Date of Patent: Jul. 31, 2018

(54) SEMICONDUCTOR TRANSISTOR DEVICE AND FABRICATION METHOD THEREOF

(71) Applicant: UNITED MICROELECTRONICS CORP., Hsin-Chu (TW)

(72) Inventors: Zhibiao Zhou, Singapore (SG); Ding-Lung Chen, Singapore (SG); Xing Hua Zhang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/655,920

(22) Filed: Jul. 21, 2017

(65) Prior Publication Data
US 2017/0358491 A1    Dec. 14, 2017

Related U.S. Application Data

(62) Division of application No. 15/200,000, filed on Jul. 1, 2016, now Pat. No. 9,754,828.

(30) Foreign Application Priority Data

Jun. 13, 2016    (CN) .......................... 2016 1 0421311

(51) Int. Cl.
*H01L 27/088* (2006.01)
*H01L 21/768* (2006.01)
*H01L 29/78* (2006.01)
*H01L 29/66* (2006.01)
*H01L 21/02* (2006.01)
*H01L 29/40* (2006.01)
(Continued)

(52) U.S. Cl.
CPC .... *H01L 21/76895* (2013.01); *H01L 21/0214* (2013.01); *H01L 21/0217* (2013.01); *H01L 21/02164* (2013.01); *H01L 29/0649* (2013.01); *H01L 29/401* (2013.01); *H01L 29/41725* (2013.01); *H01L 29/42356* (2013.01); *H01L 29/456* (2013.01); *H01L 29/66568* (2013.01); *H01L 29/66659* (2013.01); *H01L 29/7831* (2013.01)

(58) Field of Classification Search
CPC ........... H01L 21/76895; H01L 21/0214; H01L 21/02164; H01L 21/0217; H01L 29/0649; H01L 29/401; H01L 29/42356; H01L 29/456; H01L 29/66568; H01L 29/7831
USPC ....................................................... 257/401
See application file for complete search history.

(56) References Cited

U.S. PATENT DOCUMENTS 8,315,084 B2    11/2012    Liaw
8,358,012 B2    1/2013     Haran
(Continued)

FOREIGN PATENT DOCUMENTS

WO    2015094305 A1    6/2015

*Primary Examiner* — Tu-Tu Ho
(74) *Attorney, Agent, or Firm* — Winston Hsu

(57) ABSTRACT

A semiconductor transistor device includes a substrate having an active area and a trench isolation region surrounding the active area, a gate oxide layer, a gate, a spacer on a sidewall of the gate, a doping region on one side of the gate, an insulating cap layer covering the gate, the spacer and the doping region, and a redistributed contact layer (RCL) on the insulating cap layer. The RCL extends from the active area to the trench isolation region. A contact plug is disposed above the trench isolation region and is electrically connected to the gate or the doping region through the RCL.

9 Claims, 5 Drawing Sheets

(51) Int. Cl.
*H01L 29/423* (2006.01)
*H01L 29/45* (2006.01)
*H01L 29/06* (2006.01)
*H01L 29/417* (2006.01)

(56) References Cited

U.S. PATENT DOCUMENTS

| | | |
|---|---|---|
| 8,908,421 B2 | 12/2014 | Liaw |
| 8,921,947 B1 | 12/2014 | Hung |
| 2012/0313176 A1 | 12/2012 | Frohberg |
| 2013/0258759 A1 | 10/2013 | Liaw |
| 2014/0159130 A1* | 6/2014 | Lotfi ............... H01L 23/4824 257/299 |
| 2014/0167180 A1* | 6/2014 | Xiong ............... H01L 27/0629 257/379 |
| 2015/0091183 A1 | 4/2015 | Fischer |

* cited by examiner

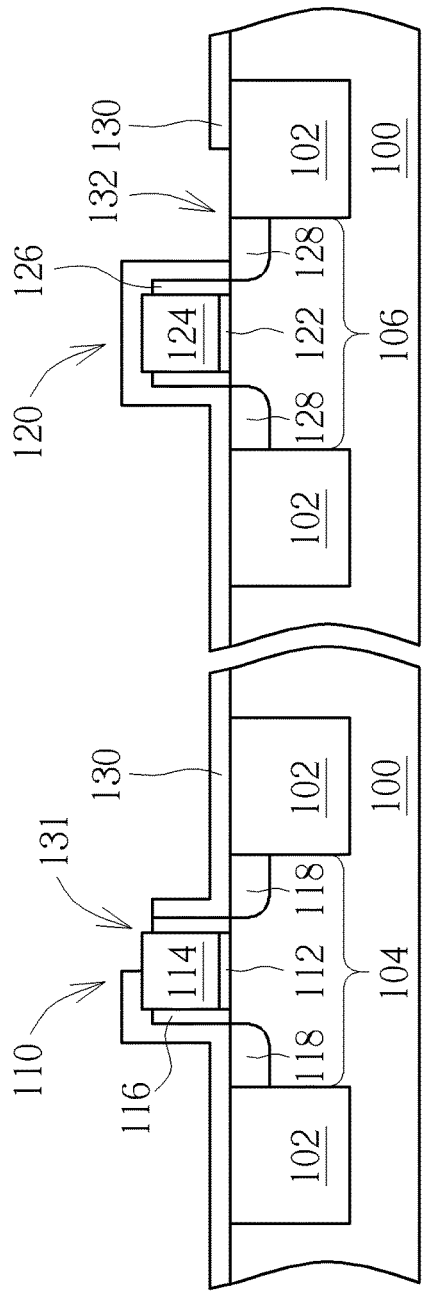
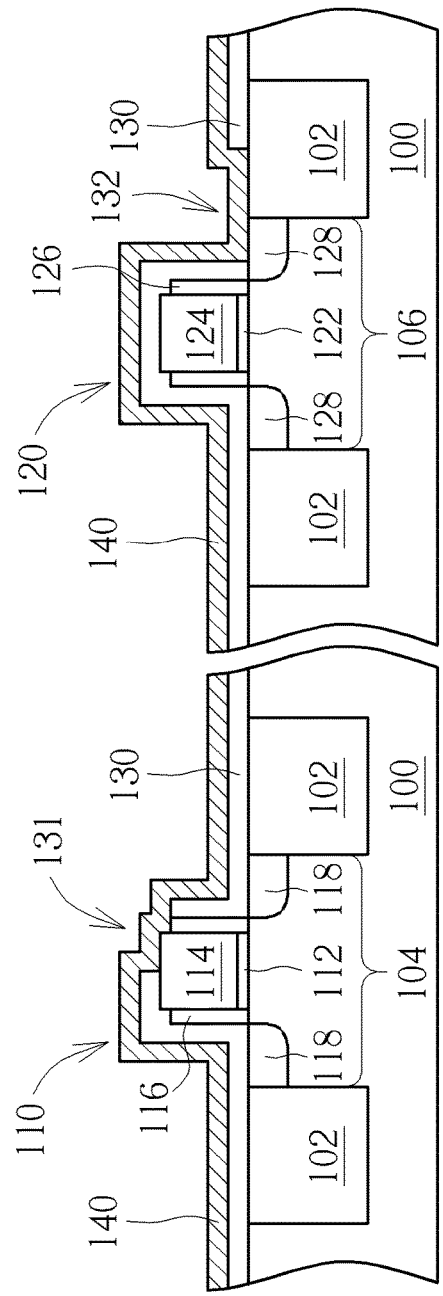
FIG. 3
FIG. 4

SEMICONDUCTOR TRANSISTOR DEVICE AND FABRICATION METHOD THEREOF

CROSS REFERENCE TO RELATED APPLICATIONS

This application is a division of U.S. application Ser. No. 15/200,000, filed Jul. 1, 2016, which is included in its entirety herein by reference.

BACKGROUND OF THE INVENTION

1. Field of the Invention

The present invention relates generally to a semiconductor transistor device and a method of fabricating the same. More particularly, the present invention relates to a semiconductor transistor device having a redistributed contact layer and a method of fabricating the same.

2. Description of the Prior Art

The trend in semiconductor technology is to construct an integrated circuit having a denser or faster semiconductor device, so that the device and circuit characteristic structure continue to shrink. In order to configure a different functional circuit for the dense semiconductor device on the integrated circuit, the semiconductor devices need to connect to each other.

Various contact structures or the interconnection structures will be formed in the fabricating process of the integrated circuit. For example, static random-access memory (SRAM) usually requires local interconnect to increase its density. SRAM uses local interconnect to electrically connect its memory storage area with its memory control area and contact plug to control its transistor.

However, as dimensions of semiconductor devices continue to shrink, how to precisely form a smaller contact hole and contact plug structures on the gates or source and drain regions, and to reduce the contact resistance as much as possible, have become the tasks and challenges in the industry.

SUMMARY OF THE INVENTION

It is one object of the invention to provide an improved semiconductor transistor device and fabrication methods thereof, which is capable of solving the above-mentioned deficiencies and shortcomings of prior art.

According to one embodiment, the present invention provides a semiconductor transistor device including: a semiconductor substrate having an active area and a trench isolation region surrounding the active area; a gate oxide layer disposed on the active area; a gate disposed on the gate oxide layer; a spacer disposed on a sidewall of the gate; a source doping region disposed in the active area on one side of the gate; a drain doping region disposed in the active area on the other side of the gate; an insulating cap layer covering the gate, the spacer, the source doping region and the drain doping region; a redistributed contact layer (RCL) on the insulating cap layer, wherein the RCL extends from the active area to the trench isolation region; and a contact plug disposed on the RCL above the trench isolation region and is electrically connected to either one of the gate, the source doping region and the drain doping region through the RCL.

According to another embodiment, the present invention provides a method of fabricating a semiconductor transistor device including: providing a semiconductor substrate having an active area and a trench isolation region surrounding the active area; forming a gate oxide layer on the active area; forming a gate on the gate oxide layer; forming a spacer on a sidewall of the gate; forming a doping region in the active area on either side of the gate; depositing an insulating cap layer on the gate, the spacer, and the doping region; forming an opening in the insulating cap layer, wherein the opening is situated above the gate or the doping region; forming a redistributed contact layer (RCL) on the insulating cap layer, wherein the RCL fills into the opening and extends from the active area to the trench isolation region; forming an interlayer dielectric (ILD) layer on the insulating cap layer and the RCL; and forming a contact plug in the ILD layer, wherein the contact plug is in direct contact with the RCL.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic, cross-sectional diagram showing an exemplary method of fabricating a semiconductor transistor device in accordance with one embodiment of the invention;

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

FIG. 1 to FIG. 6 are schematic, cross-sectional diagram showing an exemplary method of fabricating a semiconductor transistor device in accordance with one embodiment of the invention. According to the embodiment of the invention, the semiconductor transistor device may be an oxide-semiconductor field effect transistor device or silicon field effect transistor device, but is not limited thereto.

Figure 1:
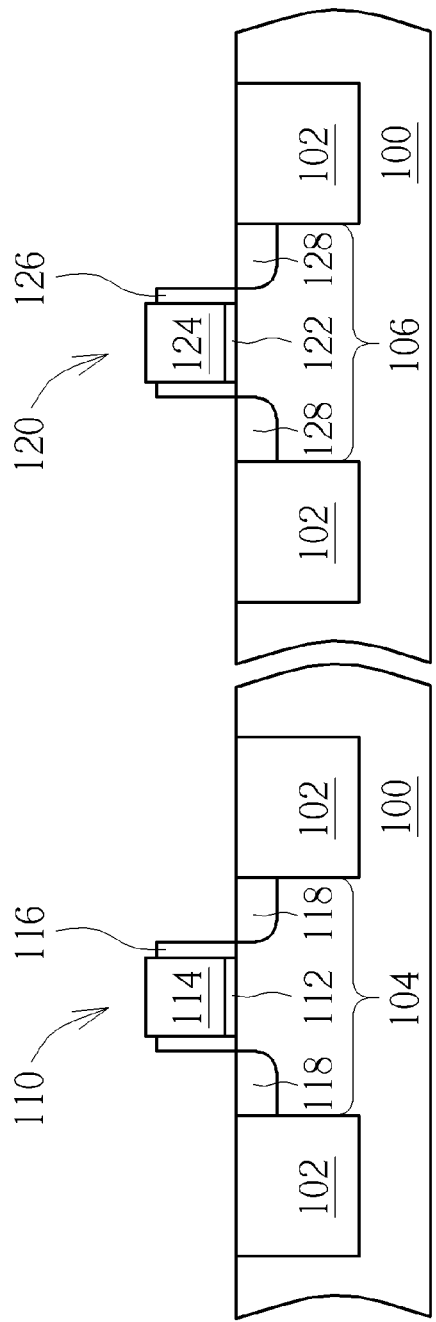

First, as shown in FIG. 1, a semiconductor substrate 100 is provided. An active area 104 and an active area 106 are formed on the semiconductor substrate 100. A trench isolation region 102 is surrounding the active area 104 and active area 106. The semiconductor substrate 100 may be a silicon substrate, a substrate containing silicon such as SiC substrate, a group IIIA and VA substrate such as GaN, a group IIIA and VA on silicon substrate such as GaN on-silicon, a graphene-on-silicon substrate, a silicon-on-insulator substrate (SOI), an epitaxial substrate or other suitable semiconductor substrates, but is not limited thereto.

Next, a gate oxide layer 112 and a gate oxide layer 122 are disposed on the active area 104 and the active area 106, respectively. Then, a gate 114 and a gate 124 are disposed on the gate oxide layer 112 and the gate oxide layer 122. The gate 114 and gate 124 may include metal or polysilicon, but is not limited thereto. Next, a spacer 116 and a spacer 126 are disposed on a sidewall of the gate 114 and gate 124. The spacer 116 and spacer 126 may include silicon oxide or silicon nitride, but is not limited thereto.

Next, an ion implantation process is conducted, thereby a doping region 118 and a doping region 128 are disposed in the active area 104 and active area 106 on one side of the gate 114 and gate 124, respectively. The doping region 118 and doping region 128 may be a source doping region or a drain doping region of the transistor. According to the embodiment of the invention, the doping region 118 and doping region 128 may include silicide such as NiSi, but is not limited thereto. According to the embodiment of the invention, a trimming process is conducted to reduce a thickness of the spacer 116 and spacer 126.

Figure 2:
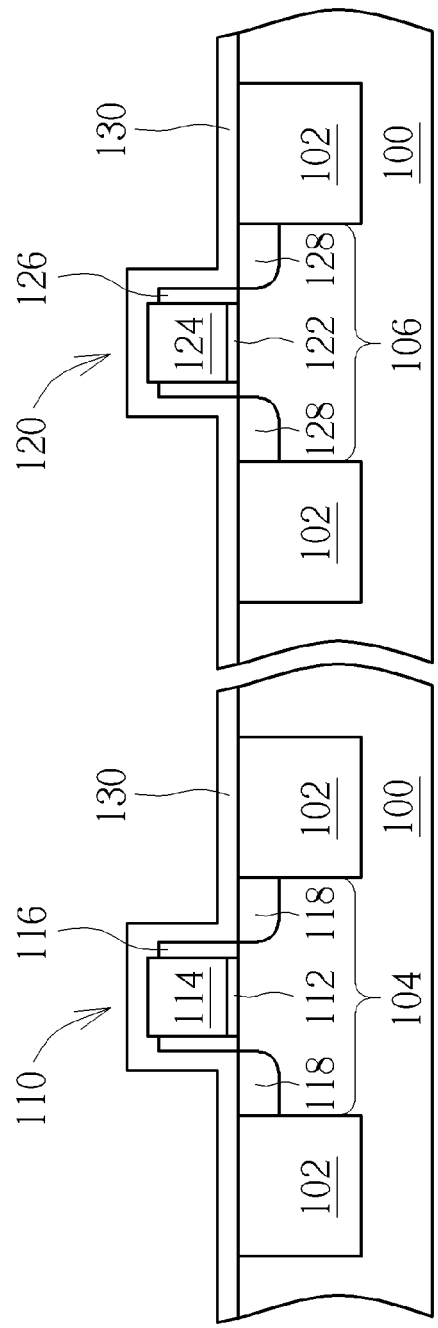

As shown in FIG. 2, next, an insulating cap layer 130 is conformally deposited on the gate 114 and gate 124, the spacer 116 and spacer 126, the doping region 118 and doping region 128, and the trench isolation region 102. According to the embodiment of the invention, for example, the insulating cap layer 130 is in direct contact with the spacer 116 and spacer 126.

As shown in FIG. 3, next, an opening 131 and an opening 132 are formed in the insulating cap layer 130, wherein the opening 131 is situated above the gate 114 and the opening 132 is situated above the doping region 128. The opening 131 exposes a portion of a top surface of the gate 114. The opening 132 exposes at least a portion of a top surface of the doping region 128 and a portion of a top surface of the trench isolation region 102.

As shown in FIG. 4, next, a conductive layer 140 is conformally deposited on the insulating cap layer 130. The conductive layer 140 may be formed by using chemical vapor deposition process, physical vapor deposition process or atomic layer deposition process, but is not limited thereto. The conductive layer 140 may include metal or metal silicide, such as Ti, TiN, W, SiNix, SiCox, SiTix, and/or SiWx, but is not limited thereto.

The conductive layer 140 fills into the opening 131 and the opening 132. The conductive layer 140 is in direct contact with the exposed portion of the top surface of the gate 114 and electrically connected to it through the opening 131. The conductive layer 140 is in contact with the exposed portion of the top surface of the doping region 128 and a portion of the top surface of the trench isolation region 102 through the opening 132.

Figure 5:
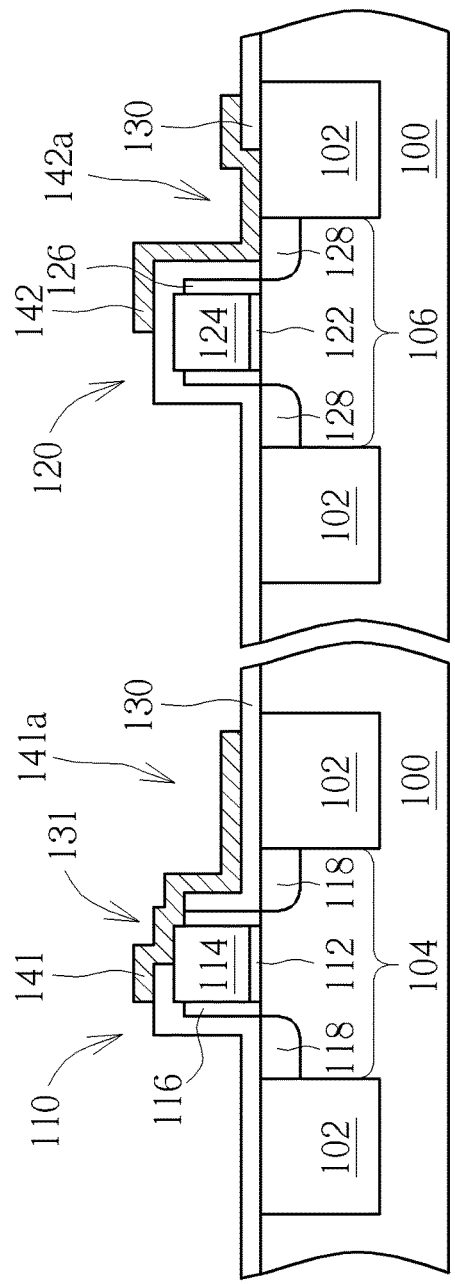

As shown in FIG. 5, next, a lithography process and an etching process are performed to pattern the conductive layer 140, thereby forming a redistributed contact layer (RCL) 141 above the active area 104 and a redistributed contact layer (RCL) 142 above the active area 106. At this point, a portion of the top surface of the insulating cap layer 130 is exposed.

According to the embodiment of the invention, the RCL 141 and RCL 142 may include metal or metal silicide, for example, RCL 141 and RCL 142 may include Ti, TiN, W, SiNix, SiCox, SiTix, and/or SiWx, but is not limited thereto.

According to the embodiment of the invention, the RCL 141 and RCL 142 respectively fill into the opening 131 and the opening 132 and extend from the active area 104 and 106 to the trench isolation region 102, and may form a bondpad structure 141a and 142a above the trench isolation region 102. The bondpad structure 141a is situated on the insulating cap layer 130 but not directly in contact the trench isolation region 102. A portion of the bondpad structure 142a may traverse on the insulating cap layer 130 and a portion of the bondpad structure 142a may directly contact the trench isolation region 102, but is not limited thereto.

Figure 6:
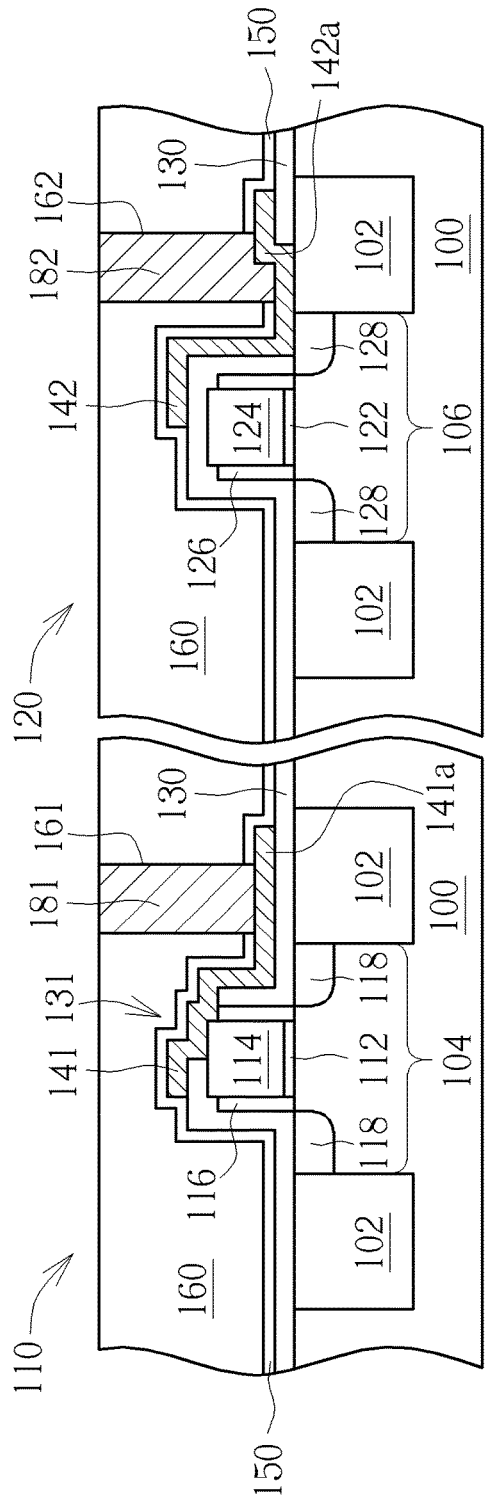

As shown in FIG. 6, after forming the RCL 141 and RCL 142, a contact etch stop layer (CESL) 150 is optionally formed on the insulating cap layer 130 and the RCL 141 and 142. Then, an inter-layer dielectric (ILD) layer 160 is deposited on the CESL 150. According to the embodiment of the invention, the contact etch stop layer (CESL) 150 may include SiN, but is not limited thereto. According to the embodiment of the invention, the inter-layer dielectric (ILD) layer 160 may include phosphorus glass (PSG), borosilicate glass (BSG), boron phosphorous silica glass (BPSG) or a low dielectric constant material, but is not limited thereto.

Next, a contact hole 161 and a contact hole 162 are formed in the ILD layer 160, in which the contact hole 161 and the contact hole 162 respectively expose the bondpad structure 141a and the bondpad structure 142a. Then, a contact plug 181 and contact plug 182 are respectively formed in the contact hole 161 and the contact hole 162, so that the contact plug 181 is directly in contact with the RCL 141 and the contact plug 182 is directly in contact with the RCL 142. The contact plug 181 is electrically connected to the gate 114 through the RCL 141 and the contact plug 182 is electrically connected to the doping region 128 through the RCL 142.

It can be seen from FIG. 6, a semiconductor transistor device 110 of the present invention includes a semiconductor substrate 100 having an active area 104 and a trench isolation region 102 surrounding the active area 104; a gate oxide layer 112 disposed on the active area 104; a gate 114 disposed on the gate oxide layer 112; a spacer 116 disposed on a sidewall of the gate 114; a doping region 118 disposed in the active area 104 on one side of the gate 114; a doping region 118 disposed in the active area 104 on the other side of the gate 114; an insulating cap layer 130 covering the gate 114, the spacer 116, and the doping region 118.

A redistributed contact layer (RCL) 141 situates on the insulating cap layer 130, wherein the RCL 141 extends from the active area 104 to the trench isolation region 102; and a contact plug 181 is disposed on the RCL 141 and 141a above the trench isolation region 102 and is electrically connected to the gate 114.

Moreover, it can be seen from FIG. 6, a semiconductor transistor device 120 of the present invention includes a semiconductor substrate 100 having an active area 106 and a trench isolation region 102 surrounding the active area 106; a gate oxide layer 122 disposed on the active area 106; a gate 124 disposed on the gate oxide layer 122; a spacer 126 disposed on a sidewall of the gate 124; a doping region 128 disposed in the active area 106 on one side of the gate 124; a doping region 128 disposed in the active area 106 on the other side of the gate 124; an insulating cap layer 130 covering the gate 124, the spacer 126, and the doping region 128.

A redistributed contact layer (RCL) 142 situates on the insulating cap layer 130, wherein the RCL 142 extends from the active area 106 to the trench isolation region 102; and a contact plug 182 is disposed on the RCL 142 and 142a above the trench isolation region 102 and is electrically connected to the doping region 128 through the RCL 142.

Figure 7:
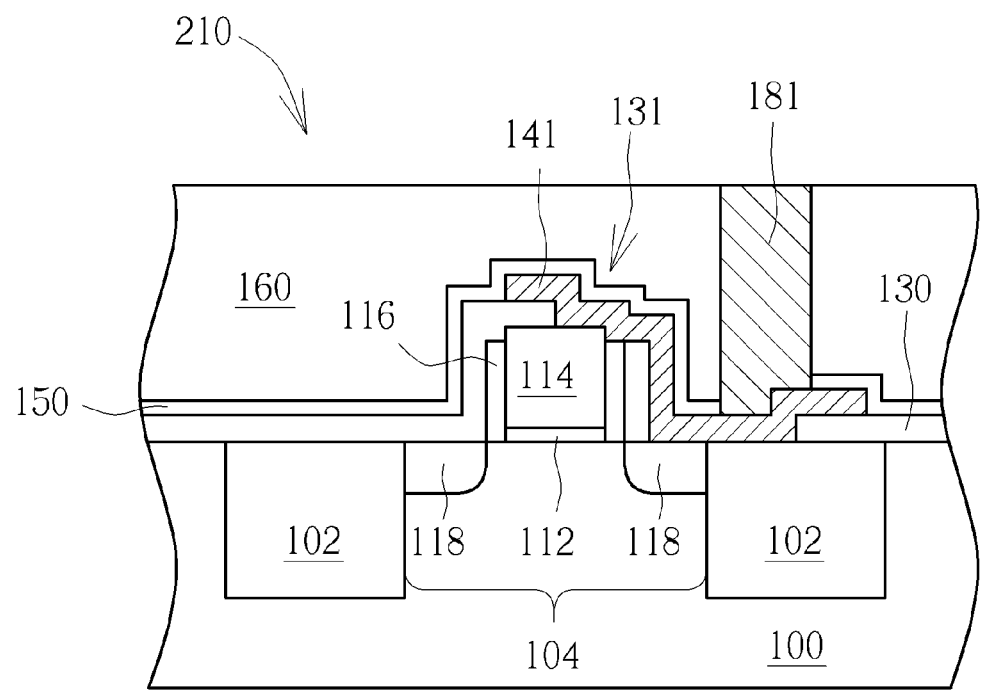
FIG. 7 is a schematic, cross-sectional diagram showing a semiconductor transistor device in accordance with another embodiment of the invention.

Please refer to FIG. 7 is a schematic, cross-sectional diagram showing a semiconductor transistor device in accordance with another embodiment of the invention, wherein like reference numerals are used to refer to like regions, elements and layers. According to the embodiment of the invention, the redistributed contact layer electrically connects the gate with one of the source doping region and the drain doping region.

As shown in FIG. 7, a semiconductor transistor device 210 includes a semiconductor substrate 100 having an active area 104 and a trench isolation region 102 surrounding the active area 104; a gate oxide layer 112 disposed on the active area 104; a gate 114 disposed on the gate oxide layer 112; a spacer 116 disposed on a sidewall of the gate 114; a doping region 118 disposed in the active area 104 on one side of the gate 114; a doping region 118 disposed in the active area 104 on the other side of the gate 114; an insulating cap layer 130 covering the gate 114, the spacer 116, and the doping region 118.

A semiconductor transistor device 210 includes a redistributed contact layer (RCL) 141 on the insulating cap layer 130, wherein the RCL 141 extends from the active area 104 to the trench isolation region 102; and a contact plug 181 is disposed on the RCL 141 above the trench isolation region 102 and is electrically connected to the gate 114 and the doping region 118 through the RCL 141.

Figure 8:
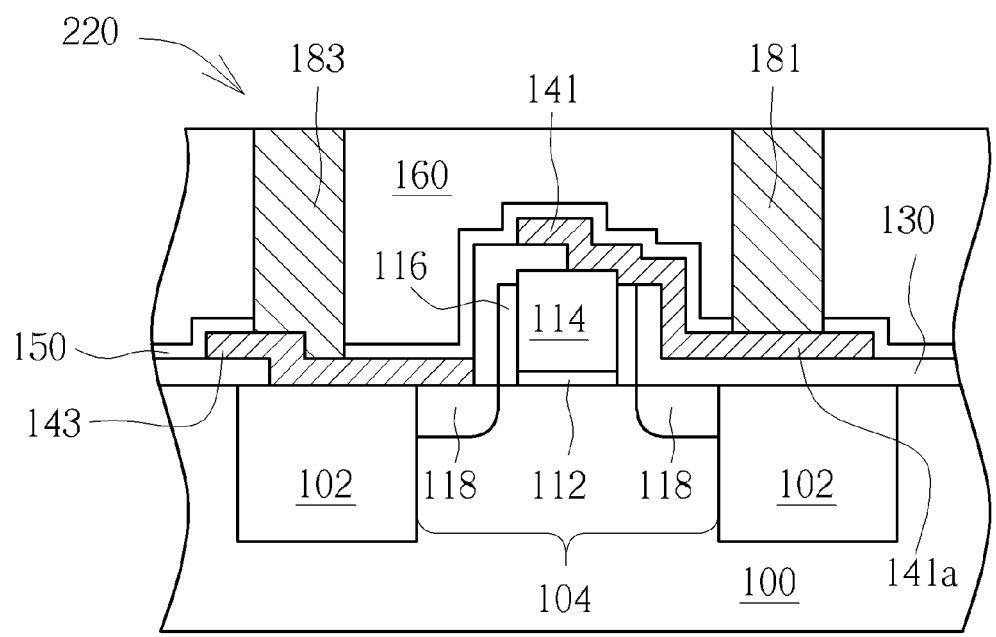
FIG. 8 is a schematic, cross-sectional diagram showing a semiconductor transistor device in accordance with another embodiment of the invention.

FIG. 8 is a schematic, cross-sectional diagram showing a semiconductor transistor device in accordance with another embodiment of the invention, wherein like reference numerals are used to refer to like regions, elements and layers. As shown in FIG. 8, a semiconductor transistor device 220 includes a semiconductor substrate 100 having an active area 104 and a trench isolation region 102 surrounding the active area 104; a gate oxide layer 112 disposed on the active area 104; a gate 114 disposed on the gate oxide layer 112; a spacer 116 disposed on a sidewall of the gate 114; a doping region 118 disposed in the active area 104 on one side of the gate 114; a doping region 118 disposed in the active area 104 on the other side of the gate 114; an insulating cap layer 130 covering the gate 114, the spacer 116, and the doping region 118.

A semiconductor transistor device 220 includes a redistributed contact layer (RCL) 141 on the insulating cap layer 130, wherein the RCL 141 extends from the active area 104 to the trench isolation region 102; and a contact plug 181 is disposed on the RCL 141 above the trench isolation region 102 and is electrically connected to the gate 114 through the RCL 141.

Figure 9:
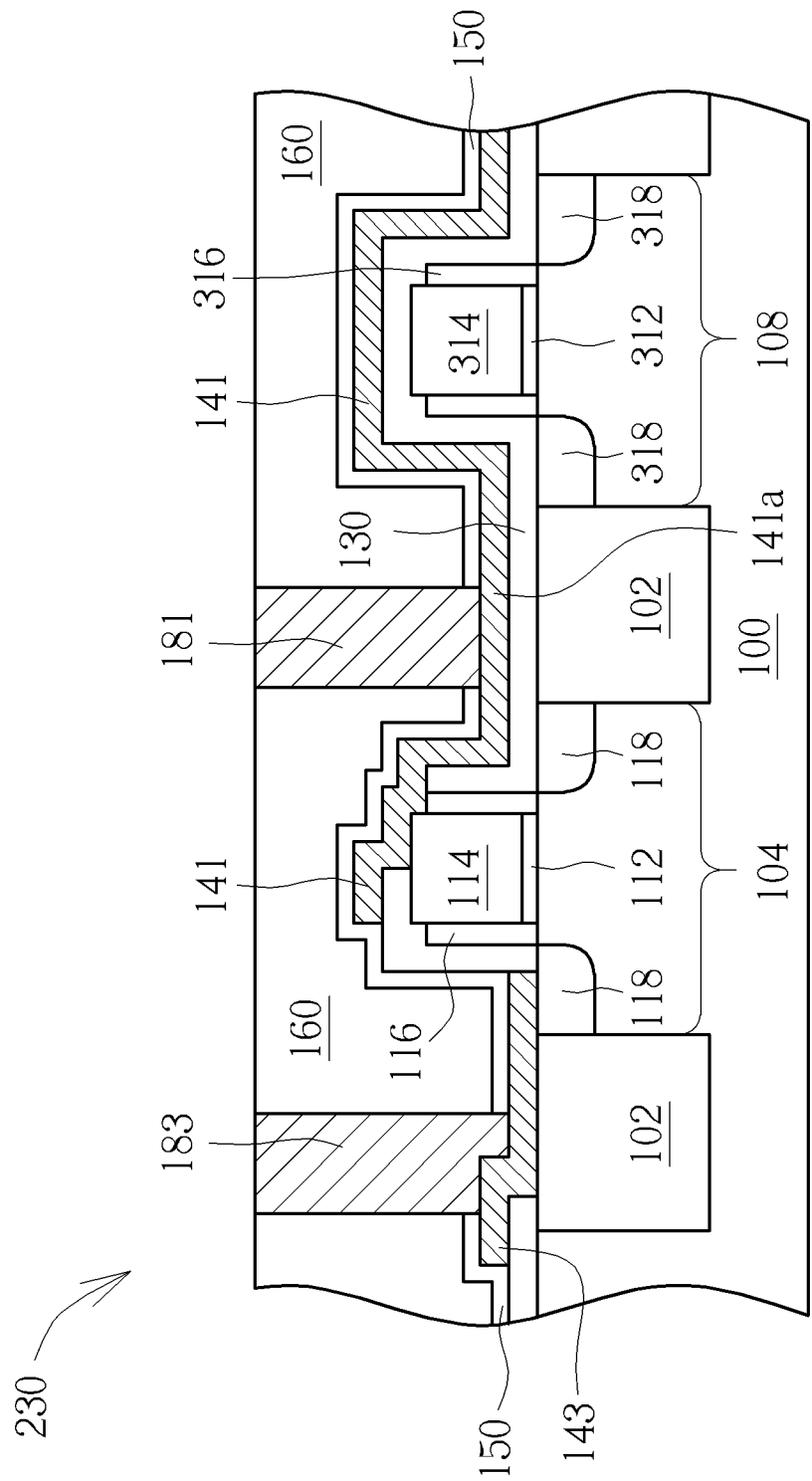
FIG. 9 is a schematic, cross-sectional diagram showing a semiconductor transistor device in accordance with another embodiment of the invention.

FIG. 9 is a schematic, cross-sectional diagram showing a semiconductor transistor device in accordance with another embodiment of the invention, wherein like reference numerals are used to refer to like regions, elements and layers. As shown in FIG. 9, a semiconductor transistor device 230 includes a semiconductor substrate 100 having an active area 104, an active area 106 and a trench isolation region 102 surrounding the active area 104; gate oxide layers 112 and 312 disposed on the active area 104 and 108; gates 114 and 314 disposed on the gate oxide layers 112 and 312; spacers 116 and 316 disposed on a sidewall of the gates 114 and 314; doping regions 118 and 318 disposed in the active area 104 and 108 on one side of the gates 114 and 314; doping regions 118 and 318 disposed in the active areas 104 and 108 on the other side of the gates 114 and 314; an insulating cap layer 130 covering the gates 114 and 314, the spacers 116 and 316, and the doping regions 118 and 318.

A semiconductor transistor device 230 includes a redistributed contact layer (RCL) 141 on the insulating cap layer 130, wherein the RCL 141 extends from the active area 104 to the trench isolation region 102; and a contact plug 181 is disposed on the RCL 141 above the trench isolation region 102 and is electrically connected to the gate 114 through the RCL 141.

A semiconductor transistor device 230 further includes a redistributed contact layer (RCL) 143 on the insulating cap layer 130, wherein the RCL 142 extends from the active area 104 to the trench isolation region 102; and a contact plug 183 disposed on the RCL 143 above the trench isolation region 102 and is electrically connected to the doping region 118 through the RCL 143.

According to the embodiment of the invention, RCL 141 may extend laterally on the insulating cap layer 130, traverse the gate 314 and electrically connect to other elements, for example, a source doping region, a drain doping region or a gate of another transistor. According to the embodiment of the invention, RCL 141 traverses the gate 314 and does not contact with the gate 314 and the doping region 318.

It is one advantage of the invention to utilize the redistributed contact layer as a local interconnect structure to thereby effectively achieve the object of shrinking the device. The present invention may be applicable to the oxide-semiconductor field effect transistor device or silicon field effect transistor device. By utilizing the redistributed contact layer as a local interconnect structure, the process window for the contact holes or contact plug is increased. Further, a common contact structure (as shown in FIG. 7) and local interconnect structure traversing the gate (as shown in FIG. 9) can be used to shrink the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of fabricating a semiconductor device, comprising:
   providing a semiconductor substrate having an active area and a trench isolation region surrounding the active area;
   forming a gate oxide layer on the active area;
   forming a gate on the gate oxide layer;
   forming a spacer on a sidewall of the gate;
   forming a doping region in the active area on either side of the gate;
   depositing an insulating cap layer on the gate, the spacer, and the doping region;
   forming an opening in the insulating cap layer, wherein the opening is situated above the gate or the doping region;
   forming a redistributed contact layer (RCL) on the insulating cap layer, wherein the RCL fills into the opening and extends from the active area to the trench isolation region;
   forming a contact etch stop layer (CESL) on the insulating cap layer and the RCL;
   forming an inter-layer dielectric (ILD) layer on the CESL; and
   forming a contact plug in the ILD layer and the CESL, wherein the contact plug is in direct contact with the RCL.
2. The method of fabricating a semiconductor device according to claim 1, wherein the CESL comprises silicon nitride.

3. The method of fabricating a semiconductor device according to claim 1, wherein after forming the spacer on the sidewall of the gate, the method further comprises:
   trimming the spacer.

4. The method of fabricating a semiconductor device according to claim 1, wherein the insulating cap layer is in direct contact with the spacer.

5. The method of fabricating a semiconductor device according to claim 1, wherein the insulating cap layer comprises SiOx, SiN or SiON.

6. The method of fabricating a semiconductor device according to claim 1, wherein the RCL comprises metal or metal silicide.

7. The method of fabricating a semiconductor device according to claim 1, wherein the RCL comprises Ti, TiN, W, SiNix, SiCox, SiTix or SiWx.

8. The method of fabricating a semiconductor device according to claim 1, wherein the doping region is a source doping region or a drain doping region.

9. The method of fabricating a semiconductor device according to claim 1, wherein the contact plug comprises Ti, TiN or W.

* * * * *